(12) United States Patent
Lee et al.

(10) Patent No.: US 10,797,007 B2
(45) Date of Patent: Oct. 6, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Hsiao-Wen Lee, Hsinchu (TW); Hsiu-Mei Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/201,187

(22) Filed: Nov. 27, 2018

(65) Prior Publication Data
US 2019/0164912 A1    May 30, 2019

Related U.S. Application Data

(60) Provisional application No. 62/591,517, filed on Nov. 28, 2017.

(51) Int. Cl.
*H01L 23/538* (2006.01)
*H01L 23/00* (2006.01)
(Continued)

(52) U.S. Cl.
CPC ........ *H01L 23/562* (2013.01); *H01L 21/4853* (2013.01); *H01L 21/4857* (2013.01); *H01L 21/6835* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 24/13* (2013.01); *H01L 24/16* (2013.01); *H01L 2221/68345* (2013.01); *H01L 2224/13014* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/13166* (2013.01); *H01L 2224/13184* (2013.01); *H01L 2224/16225* (2013.01); *H01L 2224/214* (2013.01); *H01L 2224/81192* (2013.01); *H01L 2924/1203* (2013.01);
(Continued)

(58) Field of Classification Search
CPC ............... H01L 23/562; H01L 23/5383; H01L 23/5386; H01L 23/5389; H01L 21/4853; H01L 21/4857; H01L 24/19
See application file for complete search history.

(56) References Cited

U.S. PATENT DOCUMENTS

8,987,922 B2    3/2015   Yu et al.
9,000,584 B2    4/2015   Lin et al.
(Continued)

*Primary Examiner* — Nathan W Ha
(74) *Attorney, Agent, or Firm* — WPAT, P.C., Intellectual Property Attorneys; Anthony King (57) ABSTRACT

The present disclosure provides a semiconductor structure including a first insulation, a second insulation over the first insulation, a third insulation over the second insulation, a first conductor proximal to a boundary between the first insulation and the second insulation, and an electronic device electrically connected to the first conductor and at least partially surrounded by the second insulation. A coefficient of thermal expansion (CTE) of the second insulation is larger than a CTE of the first insulation and larger than a CTE of the third insulation.

20 Claims, 10 Drawing Sheets (51) Int. Cl.
*H01L 21/48* (2006.01)
*H01L 21/683* (2006.01)

(52) U.S. Cl.
CPC ............... *H01L 2924/1304* (2013.01); *H01L 2924/1436* (2013.01); *H01L 2924/15311* (2013.01); *H01L 2924/19011* (2013.01); *H01L 2924/3511* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,511 B2 | 2/2016 | Yu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,478,504 B1 * | 10/2016 | Shen | H01L 23/49838 |
| 9,496,189 B2 | 11/2016 | Yu et al. | |
| 2011/0121444 A1 * | 5/2011 | Wu | H01L 23/49833 257/693 |
| 2014/0103527 A1 * | 4/2014 | Marimuthu | H01L 23/49833 257/737 |
| 2014/0210026 A1 * | 7/2014 | Karlsson | H01L 27/1203 257/422 |
| 2014/0327125 A1 * | 11/2014 | Chen | H01L 24/97 257/678 |
| 2015/0155243 A1 * | 6/2015 | Chen | H01L 21/565 257/724 |
| 2015/0171034 A1 * | 6/2015 | Yu | H01L 24/02 257/777 |
| 2015/0270245 A1 * | 9/2015 | Yamada | H01L 23/49816 257/724 |
| 2015/0311182 A1 * | 10/2015 | Lee | H01L 23/3737 257/734 |
| 2016/0027712 A1 * | 1/2016 | Hu | H01L 23/12 174/262 |
| 2016/0181218 A1 * | 6/2016 | Karhade | H01L 23/16 257/737 |
| 2016/0379935 A1 * | 12/2016 | Shih | H01L 23/49816 257/738 |
| 2017/0154856 A1 * | 6/2017 | Standing | H01L 24/30 |
| 2017/0287871 A1 * | 10/2017 | Lu | H01L 23/24 |
| 2017/0330841 A1 * | 11/2017 | Cook | H01L 21/4825 |
| 2018/0061727 A1 * | 3/2018 | Lyu | H01L 23/28 |
| 2018/0068958 A1 * | 3/2018 | Cho | H01L 23/481 |
| 2018/0082933 A1 * | 3/2018 | Ko | H01L 23/562 |
| 2018/0096974 A1 * | 4/2018 | Lin | H01L 25/105 |
| 2018/0114736 A1 * | 4/2018 | Wang | H01L 21/2885 |
| 2018/0138101 A1 * | 5/2018 | Yu | H01L 23/3114 |
| 2018/0145036 A1 * | 5/2018 | Kim | H01L 24/20 |
| 2018/0261573 A1 * | 9/2018 | Chen | H01L 21/4853 |
| 2018/0358304 A1 * | 12/2018 | Hsu | H01L 23/562 |
| 2020/0006254 A1 * | 1/2020 | Chen | H01L 23/3135 |

* cited by examiner

SEMICONDUCTOR STRUCTURE AND MANUFACTURING METHOD THEREOF

PRIORITY CLAIM AND CROSS-REFERENCE

This application claims the benefit of U.S. provisional application Ser. No. 62/591,517 filed on Nov. 28, 2017 and entitled "Semiconductor Structure and Manufacturing Method Thereof," the disclosure of which is hereby incorporated by reference in its entirety.

BACKGROUND

Electronic equipment using semiconductor structures is essential for many modern applications. With the advancement of electronic technology, the semiconductor structures are steadily becoming more compact while offering greater functionality and including greater amounts of integrated circuitry. With the increasing functionality and compact scale of the semiconductor structure, numerous manufacturing operations are implemented with increased complexity.

The manufacturing operations of the semiconductor structure involve many steps and operations on a compact semiconductor structure. The manufacturing of the semiconductor structure with an increased interconnect density is becoming increasingly complicated. An increase in complexity of manufacturing the semiconductor structure may result in deficiencies such as degraded electrical performance or other issues, resulting in a high yield loss of the semiconductor structure and increase in manufacturing cost. As such, there are many challenges for modifying a structure of the semiconductor structures and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled," and the term "connected" may be termed as "electrically connected." "Coupled" and "connected" may also be used to indicate that two or more elements cooperate or interact with each other.

Other features and processes may also be included. For example, testing structures may be included to aid in the verification testing of 3D packaging or 3DIC devices. The testing structures may include, for example, test pads formed in a redistribution layer or on a substrate that allows the testing of the 3D packaging or 3DIC device, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

With the advancement of electronic technology, semiconductor or package structures are steadily becoming more compact while providing greater functionality and including greater amounts of integrated circuitry. To perform high-speed system packaging, substrates with low equivalent series resistance (ESR) or low equivalent series inductance (ESL) are needed to enable high-speed packaging approaches, such as system on chip (SoC) packaging. One approach includes embedding an electronic device, such as a passive capacitor, inside a substrate to shorten the transmission path or to further increase interconnect density, thereby allowing the bandwidth to be improved over that provided by approaches in which the electronic device is assembled on a top surface of the substrate.

However, embedding an electronic device in a core layer of a substrate limits the pitch or length of the routing structure above or under the core layer. To achieve greater electronic device density per area, or higher bandwidth, substrates with an electronic device embedded in a coreless layer are needed. However, a coreless substrate presents the risk of warpage, which may result in poor connection or low yield. A solution to prevent warpage is needed for the packaging approaches in which an electronic device or a chip is embedded in a coreless layer of a substrate.

In some embodiments of the present disclosure, a semiconductor structure is disclosed. The semiconductor structure includes a first insulation, a second insulation over the first insulation, a third insulation over the second insulation, a first conductor proximal to a boundary between the first insulation and the second insulation, and an electronic device electrically connected to the first conductor and at least partially surrounded by the second insulation. A coefficient of thermal expansion (CTE) of the second insulation is larger than a CTE of the first insulation and a CTE of the third insulation. In some embodiments of the present disclosure, the semiconductor structure includes a first insulation, a second insulation over the first insulation, a die over the second insulation, a first conductor proximal to a boundary between the first insulation and the second insulation, and an electronic device bonded with the first conductor and at least partially surrounded by the second insulation and electrically connected to the die. A CTE of the second insulation is larger than a CTE of the first insulation and a CTE of the die.

The general purpose of the present disclosure provides one or more of the following advantages: (1) improved bandwidth and reliability margin at least due to an electronic device being embedded in a coreless layer; (2) matched shear strength around the top and bottom portions of the embedded electronic device at least due to symmetric small CTE or high stiffness materials at the top and bottom layers; (3) low warpage or strain exhibited by the embedded electronic device at least due to the high CTE or low stiffness material around the electronic device; and (4) low overall warpage at least due to low CTE or high stiffness material at the top and bottom layers.

Figure 1:
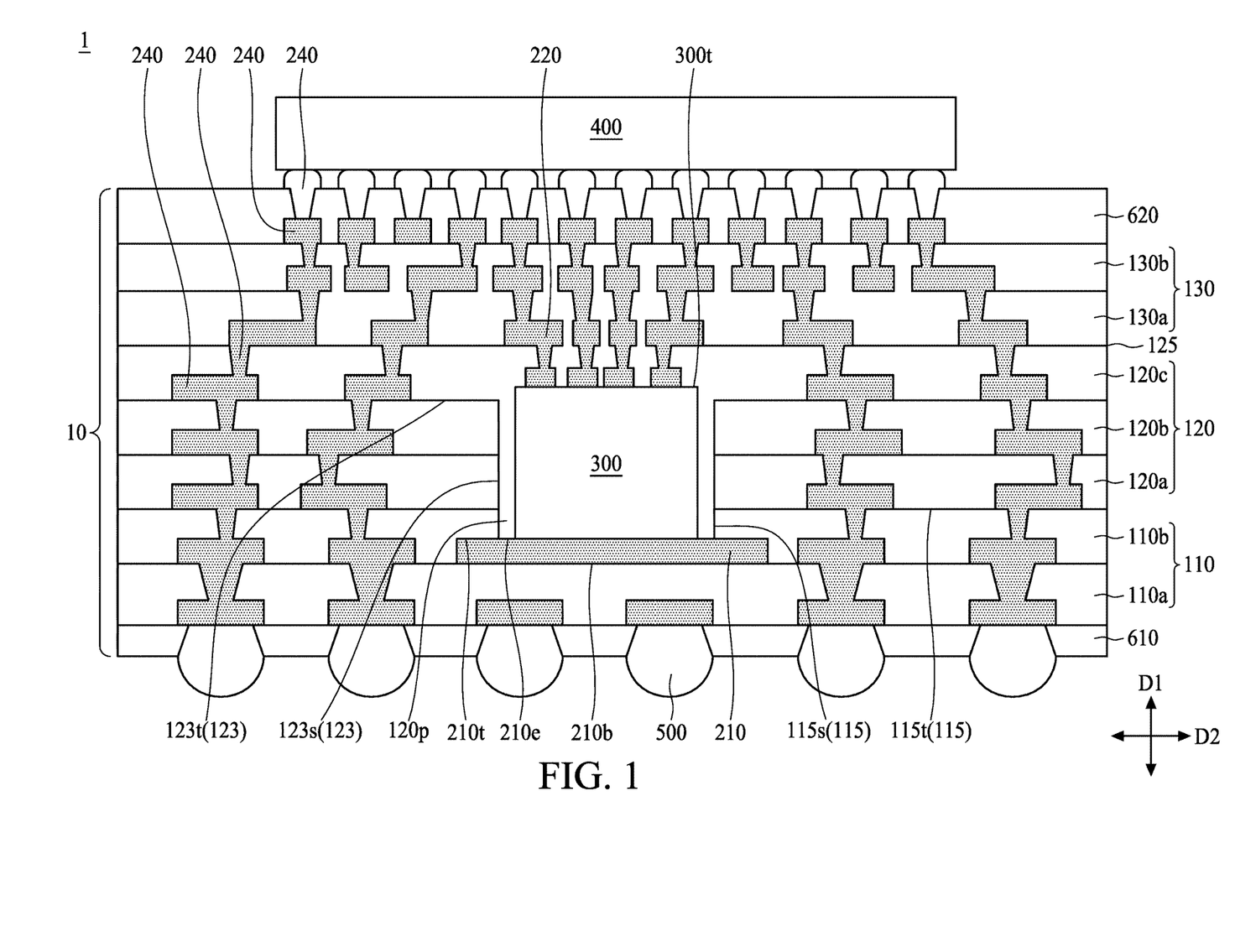
FIG. 1 is a cross-sectional view of a semiconductor structure in accordance with some embodiments of the present disclosure.
Figure 2:
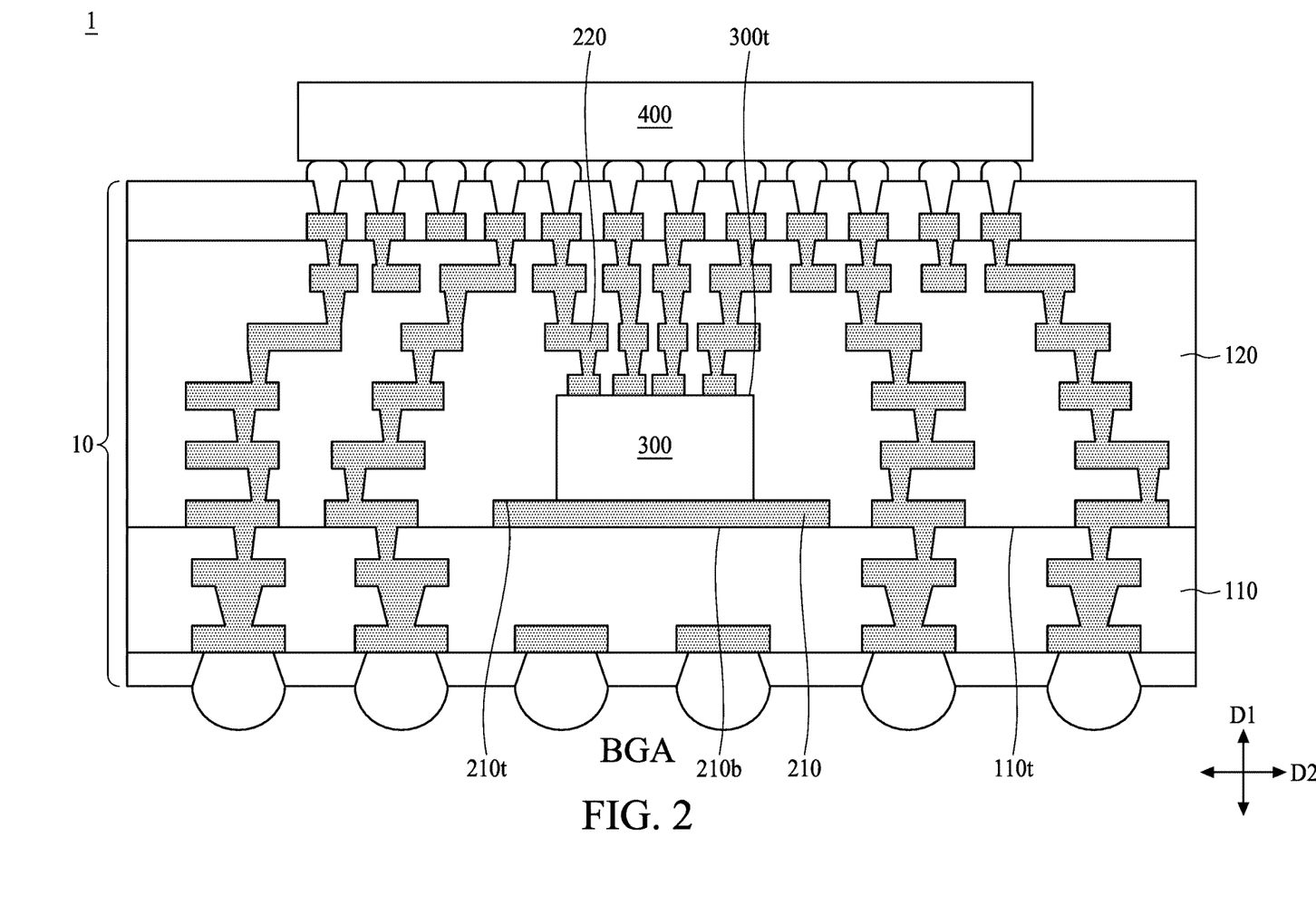
FIG. 2 is a cross-sectional view of a semiconductor structure in accordance with some embodiments of the present disclosure.

FIGS. 1 and 2 are examples of cross-sectional views of a semiconductor structure 1 in accordance with some embodiments of the present disclosure. The semiconductor structure 1 includes a first insulation 110, a second insulation 120, a third insulation 130, a die 400, a first conductor 210, and an electronic device 300. In some embodiments, the semiconductor structure 1 is a semiconductor package. In some embodiments, the semiconductor structure 1 is a multi-dimensional package such as a 3-dimensional (3D) package. In some embodiments, the semiconductor structure 1 is a part of a fan-out (FO) or fan-in (FI) package. In some embodiments, the interconnect structure 1 is a part of a flip chip ball grid array (FCBGA) package.

In some embodiments, the semiconductor structure 1 includes a substrate 10 formed by at least one of the first insulation 110, the second insulation 120, and the third insulation 130. In some embodiments, the substrate 10 has a coefficient of thermal expansion (CTE) gradient distribution along a first direction D1. In some embodiments, the first direction D1 is a vertical direction. In some embodiments, a CTE in a middle portion is larger than a CTE in a top portion or a CTE in a bottom portion of the substrate 10 along the first direction D1. In some embodiments, the substrate 10 has a Young's modulus or stiffness gradient distribution along the first direction D1. In some embodiments, a Young's modulus in a middle portion is lower than a Young's modulus in a top portion or lower than a Young's modulus in a bottom portion of the substrate 10 along the first direction D1. In some embodiments, the CTE gradient distribution or the Young's modulus gradient distribution of the substrate 10 is affected in part by the arrangement of the first insulation 110, the second insulation 120, and the third insulation 130.

In some embodiments, the substrate 10 is fabricated with a predetermined functional circuit thereon. In some embodiments, the substrate 10 includes several conductive lines and several electrical components such as a transistor, a diode, or other electrical component connected by the conductive lines. In some embodiments, the substrate 10 is a semiconductive substrate. In some embodiments, the substrate 10 is an interposer or an interconnection structure. In some embodiments, the substrate 10 can be a printed circuit board (PCB).

As shown in FIGS. 1 and 2, in some embodiments, the first insulation 110 is disposed in the vicinity of a bottom portion of the semiconductor structure 1 along the first direction D1. In some embodiments, the first insulation 110 includes several layers. For example, as shown in FIG. 1, the first insulation 110 includes layers 110a and 110b. In some embodiments, different layers of the first insulation 110 have different materials. In some embodiments, different layers of the first insulation 110 have similar or same materials.

In some embodiments, a coefficient of thermal expansion (CTE) of the first insulation 110 is between about $1 \times 10^{-6}/^\circ$ C. and about $10 \times 10^{-6}/^\circ$ C. In some embodiments, a Young's modulus of the first insulation 110 is between about 15 GPa and about 90 GPa. In some embodiments, the first insulation 110 includes a glass cloth primer (GCP) material. In some embodiments, the first insulation 110 includes at least one glass-clothed layer, such as the layers 110a and 110b.

In some embodiments, the second insulation 120 is disposed in a middle portion of the semiconductor structure 1 along the first direction D1. In some embodiments, the second insulation 120 is disposed over the first insulation 110. In some embodiments, the second insulation 120 is in contact with the first insulation 110, with a boundary 115 between the first insulation 110 and the second insulation 120. In some embodiments, as shown in FIG. 1, a portion 120p of the second insulation 120 protrudes into the first insulation 110 and is surrounded by the first insulation 110. In some embodiments, the boundary 115 includes a first portion 115s and a second portion 115t, wherein the first portion 115s and the second portion 115t are not parallel. In some embodiments, the first portion 115s extends along the first direction D1 and the second portion 115t extends along a second direction D2 perpendicular to the first direction D1. In some embodiments, the second direction D2 is a lateral direction. For example, as shown in FIG. 1, an angle between the first portion 115s and the second portion 115t is about 90 degrees. In some embodiments, as shown in FIG. 2, a boundary between the first insulation 110 and the second insulation 120 is a surface 110t of the first insulation 110, and the boundary does not include two non-parallel portions. The surface 110t faces the second insulation 120.

In some embodiments, the second insulation 120 includes several layers. For example, as shown in FIG. 1, the second insulation 120 includes layers 120a, 120b and 120c. In some embodiments, different layers of the second insulation 120 have different materials. In some embodiments, different layers of the second insulation 120 have similar or same materials. In some embodiments, as shown in FIG. 1, a portion 120p of the layer 120c protrudes downward through the layers 120b and 120a, and into the first insulation 110, and is surrounded by the first insulation 110. In some embodiments, a boundary 123 exists between the layer 120c and the layers 120b and 120a. In some embodiments, the boundary 123 includes a first portion 123s and a second portion 123t, wherein the first portion 123s and the second portion 123t are not parallel. In some embodiments, the first portion 123s extends along the first direction D1 and the second portion 123t extends along the second direction D2. For example, as shown in FIG. 1, an angle between the first portion 123s and the second portion 123t is about 90 degrees. In some embodiments, a junction of the first portion 123s and the second portion 123t is a rounding portion with a curvature, not a sharp angle. In some embodiments, the first portion 123s is tilted with respect to the first direction D1. In some embodiments, the portion 120p has a tapered shape.

In some embodiments, a CTE of the second insulation 120 is larger than a CTE of the first insulation 110. In some embodiments, a Young's modulus of the second insulation 120 is lower than a Young's modulus of the first insulation 110. In some embodiments, a ratio of the second insulation 120's CTE to the first insulation 110's CTE is between about 1.5 and about 100. In some embodiments, a ratio of the first insulation 110's Young's modulus to the second insulation 120's Young's modulus is between about 1.25 and about 90. In some embodiments, a CTE of the second insulation 120 is between about $15 \times 10^{-6}/°$ C. and about $100 \times 10^{-6}/°$ C. In some embodiments, a Young's modulus of the second insulation 120 is between about 1 GPa and about 12 GPa. In some embodiments, the second insulation 120 includes an ajinomoto build-up film (ABF) material. In some embodiments, the second insulation 120 is a coreless layer. In some embodiments, the second insulation 120 is configured for strain absorption and for reducing warpage stress caused to the electronic device 300. In some embodiments, the second insulation 120 may reduce an insertion loss and shorten a transmission path for the semiconductor structure 1.

In some embodiments, the third insulation 130 is disposed in the vicinity of a top portion of the semiconductor structure 1 along the first direction D1. In some embodiments, the third insulation 130 is disposed over the second insulation 120. In some embodiments, the third insulation 130 is in contact with the second insulation 120, with a boundary 125 between the second insulation 120 and the third insulation 130. In some embodiments, the third insulation 130 includes several layers. For example, as shown in FIG. 1, the third insulation 130 includes layers 130a and 130b. In some embodiments, different layers of the third insulation 130 have different materials. In some embodiments, different layers of the third insulation 130 have similar or same materials.

In some embodiments, a CTE of the second insulation 120 is larger than a CTE of the third insulation 130. In some embodiments, a Young's modulus of the second insulation 120 is lower than a Young's modulus of the third insulation 130. In some embodiments, the third insulation 130 has a CTE about the same as that of the first insulation 110. In some embodiments, the third insulation 130 has a Young's modulus about the same as that of the first insulation 110. In some embodiments, the third insulation 130 includes a GCP material. In some embodiments, the third insulation 130 includes at least one glass-clothed layer, such as the layers 130a and 130b. In some embodiments, the third insulation 130 and the first insulation 110 have similar or same materials, resulting in a low shear force difference between the top and bottom areas of the semiconductor structure 1 and the embedded electronic device 300. In some embodiments, as shown in FIG. 2, the semiconductor structure 1 does not include a third insulation in the vicinity of a top portion of the semiconductor structure 1 along the first direction D1.

In some embodiments, the first conductor 210 is disposed proximal to the boundary 115 between the first insulation 110 and the second insulation 120. In some embodiments, the first conductor 210 is at least partially surrounded by the first insulation 110. In some embodiments, as shown in FIG. 1, the first conductor 210 is disposed in the first insulation 110 and is in contact with the portion 120p protruding from the second insulation 120 into the first insulation 110. In some embodiments, the first conductor 210 includes a surface 210t facing the second insulation 120. In some embodiments, an area 210e of the surface 210t surrounds the portion 120p from a top view perspective. In some embodiments, the area 210e overlaps with an area within an outline or a periphery of the portion 120p from a top view perspective. In some embodiments, the area 210e is a dented area and dents into the first conductor 210. In some embodiments, a level of the area 210e is lower, in the first direction D1, than a level of another area of the surface 210t. In some embodiments, the area 210e has a roughness greater than that of another area of the surface 210t. In some embodiments, the first conductor 210 is configured to be a stop layer during a process of manufacturing the semiconductor structure 1. In some embodiments, the area 210a is configured to stop an etching or laser drilling process during a process of manufacturing the semiconductor structure 1.

In some embodiments, the surface 210t of the first conductor 210 is coplanar with the surface 110t of the first insulation 110. In some embodiments, a portion of the surface 210t of the first conductor 210 is covered by the first insulation 110. In some embodiments, a portion of the surface 210t of the first conductor 210 is exposed to the second insulation 120. In some embodiments, a surface 210b of the first conductor 210 is coplanar with the surface 110t of the first insulation 110 and faces away from the third insulation 130. In some embodiments, the first conductor 210 is formed on the first insulation 110. In some embodiments, the second insulation 120 is formed over the first conductor 210. In some embodiments, the first conductor 210 includes gold, silver, copper, nickel, tungsten, aluminum, titanium, palladium and/or alloys thereof. In some embodiments, the first conductor 210 has a cylindrical, hemispherical or spherical shape. In some embodiments, the first conductor 210 is configured to be a landing pad for the electronic device 300.

In some embodiments, the electronic device 300 is embedded within the substrate 10. In some embodiments, the electronic device 300 is disposed over the first conductor 210. In some embodiments, the electronic device 300 is electrically connected to the first conductor 210. In some embodiments, the electronic device 300 is bonded on the first conductor 210. In some embodiments, the electronic device 300 is in direct contact with the first conductor 210. In some embodiments, the electronic device 300 is bonded on the area 210a. In some embodiments, the electronic device 300 is at least partially surrounded by at least one of the second insulation 120, the first insulation 110 and the third insulation 130. In some embodiments, the electronic device 300 is mostly surrounded by the second insulation 120. In some embodiments, the electronic device 300 is fully surrounded by the second insulation 120. In some embodiments, the electronic device 300 is at least partially sealed by or embedded within at least one of the second insulation 120, the first insulation 110 and the third insulation 130. In some embodiments, the electronic device 300 is not in contact with the first insulation 110 or the third insulation 130. In some embodiments, the protruding portion 120p of the second insulation 120 is between the electronic device 300 and the first insulation 110 from a top view perspective. In some embodiments, the portion 120p surrounds the electronic device 300 from a top view perspective.

In some embodiments, a surface 300t of the electronic device 300 is proximal to the boundary 125 between the second insulation 120 and the third insulation 130. The surface 300t faces away from the first insulation 110. In some embodiments, the surface 300t is covered by the second insulation 120. In some embodiments, the surface 300t is exposed to the third insulation 130. In some embodiments, the third insulation 130 is disposed over the electronic device 300.

In some embodiments, the electronic device 300 comprises semiconductive materials such as silicon, and is fabricated with a predetermined functional circuit within the electronic device 300 produced by photolithography or any suitable operations. In some embodiments, the electronic device 300 is singulated from a silicon wafer by a mechanical blade or laser blade. In some embodiments, the electronic device 300 is a chip, a passive device, an active device, a line conductor, a microstrip structure, or the like. In some embodiments, the electronic device 300 comprises a variety of electrical circuits suitable for a particular application. In some embodiments, the electrical circuits include various devices such as transistors, capacitors, resistors, diodes, and/or the like. In some embodiments, the electronic device 300 includes capacitors, resistors, inductors, or the like. In some embodiments, the electronic device 300 is an integrated passive device (IPD). In some embodiments, the electronic device 300 is a logic device, graphics processing unit (GPU), application processing (AP) device, memory device, dynamic random access memory (DRAM) device, static random access memory (SRAM) device, high bandwidth memory (HBM) device, or the like. In some embodiments, the electronic device 300 has a top cross section (a cross section from a top view of the interconnect structure 1) having a quadrilateral, a rectangular or a square shape.

In some embodiments, a CTE of the second insulation 120 is larger than a CTE of the electronic device 300. In some embodiments, a Young's modulus of the second insulation 120 is lower than a Young's modulus of the electronic device 300. In some embodiments, the difference between a CTE of the electronic device 300 and a CTE of the first insulation 110 or a CTE of the third insulation 130 is less than the difference between the CTE of the electronic device 300 and a CTE of the second insulation 120. In some embodiments, the difference between a Young's modulus of the electronic device 300 and a Young's modulus of the first insulation 110 or a Young's modulus of the third insulation 130 is less than the difference between the Young's modulus of the electronic device 300 and a Young's modulus of the second insulation 120.

In some embodiments, the die 400 is disposed over the third insulation 130. In some embodiments, the die 400 is disposed over the second insulation 120. In some embodiments, the die 400 is electrically connected to the electronic device 300. In some embodiments, the die 400 is proximal to the surface 300t of the electronic device 300. In some embodiments, the die 400 is bonded with the surface 300t. In some embodiments, the die 400 is in contact with the electronic device 300. In some embodiments, the die 400 comprises semiconductive materials such as silicon, and the die 400 is fabricated with a predetermined functional circuit included within the die 400. The predetermined functional circuit is produced by operations such as photolithography, etching, deposition, and other operations. In some embodiments, the die 400 is singulated from a silicon wafer by a mechanical blade or a laser blade.

In some embodiments, the die 400 is a chip, a device or the like. In some embodiments, the die 400 comprises a variety of electrical circuits suitable for a particular application. In some embodiments, the electrical circuits include various devices such as transistors, capacitors, resistors, diodes, and/or the like. In some embodiments, the die 400 includes capacitors, resistors, inductors, or the like. In some embodiments, the die 400 is an integrated passive device (IPD). In some embodiments, the die 400 is a logic device, graphics processing unit (GPU), application processing (AP) device, memory device, dynamic random access memory (DRAM) device, static random access memory (SRAM) device, high bandwidth memory (HBM) device, or the like. In some embodiments, the die 400 has a top-view cross section (i.e., a cross section of the semiconductor structure 1 as viewed from a top view perspective) having a quadrilateral, a rectangular or a square shape.

In some embodiments, a CTE of the second insulation 120 is larger than a CTE of the die 400. In some embodiments, a Young's modulus of the second insulation 120 is lower than a Young's modulus of the die 400. In some embodiments, the die 400 is configured to provide a small CTE or high Young's modulus distribution in a top portion of the semiconductor structure 1. In some embodiments, the die 400 is configured to match the electronic device 300 in the aspects of CTE or Young's modulus, thus reducing a shear strain or stress between the die 400 and the electronic device 300.

In some embodiments, a second conductor 220 is disposed proximal to a boundary between the second insulation 120 and the third insulation 130. In some embodiments, the second conductor 220 is electrically connected to the electronic device 300 or the die 400. In some embodiments, a portion of the second conductor 220 is surrounded by the second insulation 120, and another portion of the second conductor 220 is surrounded by the third insulation 130. In some embodiments, the semiconductor structure 1 includes several conductors 240. For example, one of the conductors 240 may be disposed in the first layer 110, the second layer 120 or the third layer 130. In some embodiments, the conductors 240 include structures such as an interconnect structure, a via, or a redistribution layer (RDL). In some embodiments, one of the connectors 240 has a cylindrical, hemispherical or spherical shape. In some embodiments, each of the conductors 240 includes gold, silver, copper, nickel, tungsten, aluminum, titanium, palladium and/or alloys thereof.

In some embodiments, the semiconductor structure 1 includes several conductive bumps 500. In some embodiments, the conductive bumps 500 comprise solder or ENEPIG. In some embodiments, the conductive bumps 500 are controlled collapse chip connection (C4) bumps. In some embodiments, the conductive bumps 500 are configured to electrically connect the semiconductor structure 1 to a motherboard, a circuit or another device. In some embodiments, the conductors 240 are configured to establish electrical connection between the electrical device 300, the die 400, the conductive bumps 500, the first conductor 210 and/or the second conductor 220.

In some embodiments, the semiconductor structure 1 includes a first polymeric layer 610 disposed under the first insulation 110 and a second polymeric layer 620 disposed above the third insulation 130. In some embodiments, the second polymeric layer 620 is disposed under the die 400. In some embodiments, the second polymeric layer 620 partially surrounds the die 400. In some embodiments, the first polymeric layer 610 or the second polymeric layer 620 surrounds one of the conductors 240 or the conductive bumps 500. In some embodiments, the first polymeric layer 610 or the second polymeric layer 620 includes resin, ABF resin or epoxy.

Figure 3:
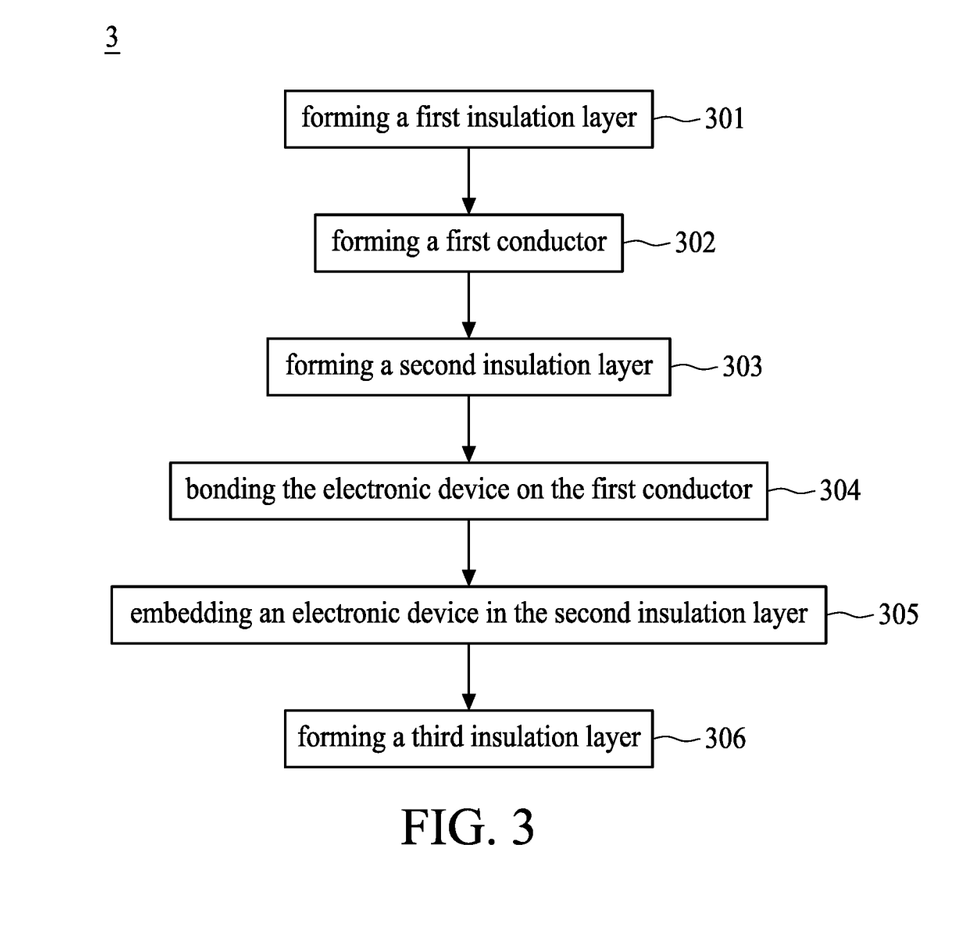
FIG. 3 is a flow diagram of a method of manufacturing a semiconductor structure in accordance with some embodiments of the present disclosure.

FIG. 3 is a flow diagram of a method 3 of manufacturing a semiconductor structure in accordance with one embodiment of the present disclosure. The method 3 includes a number of operations 301, 302, 303, 304, 305, and 306. The operation of the method 3 is not limited to the sequence order represented in accordance to the embodiment as shown in FIG. 3. For instance, operation 304 can precede operation 303.

Figure 4A:
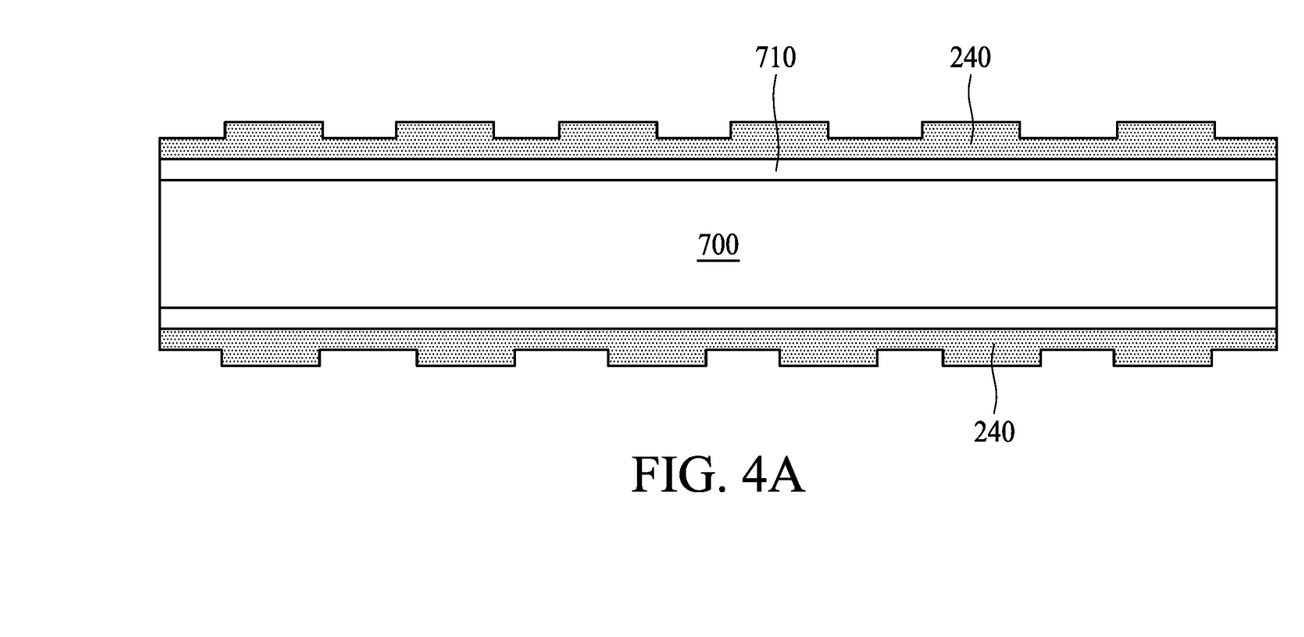
FIGS. 4A to 4G are cross-sectional views during manufacturing stages of a semiconductor structure in accordance with some embodiments of the present disclosure.

FIGS. 4A to 4G are cross-sectional views during manufacturing stages of a semiconductor structure in accordance with some embodiments of the present disclosure. In FIG. 4A, a carrier 700 with several connectors 240 attached by an adhesive material 710 is provided. In some embodiments, the carrier 700 is a carrier core layer. The following operations are same for the upper side and the lower side of the carrier 700.

Figure 4B:
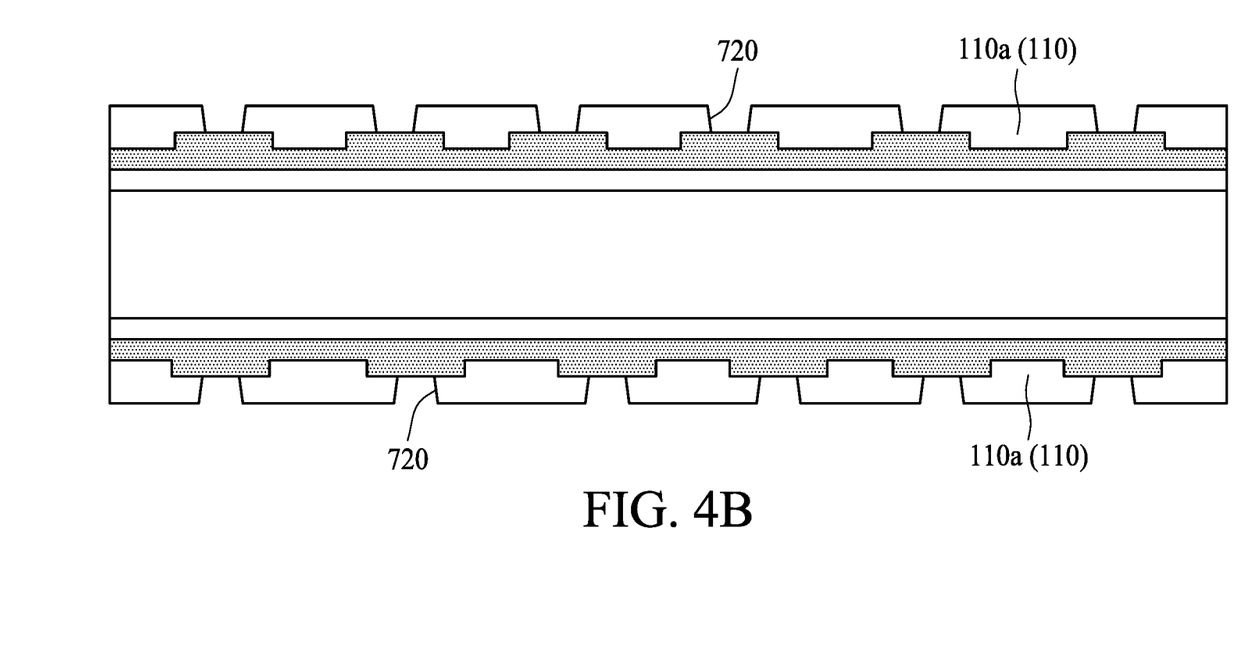
Figure 4C:
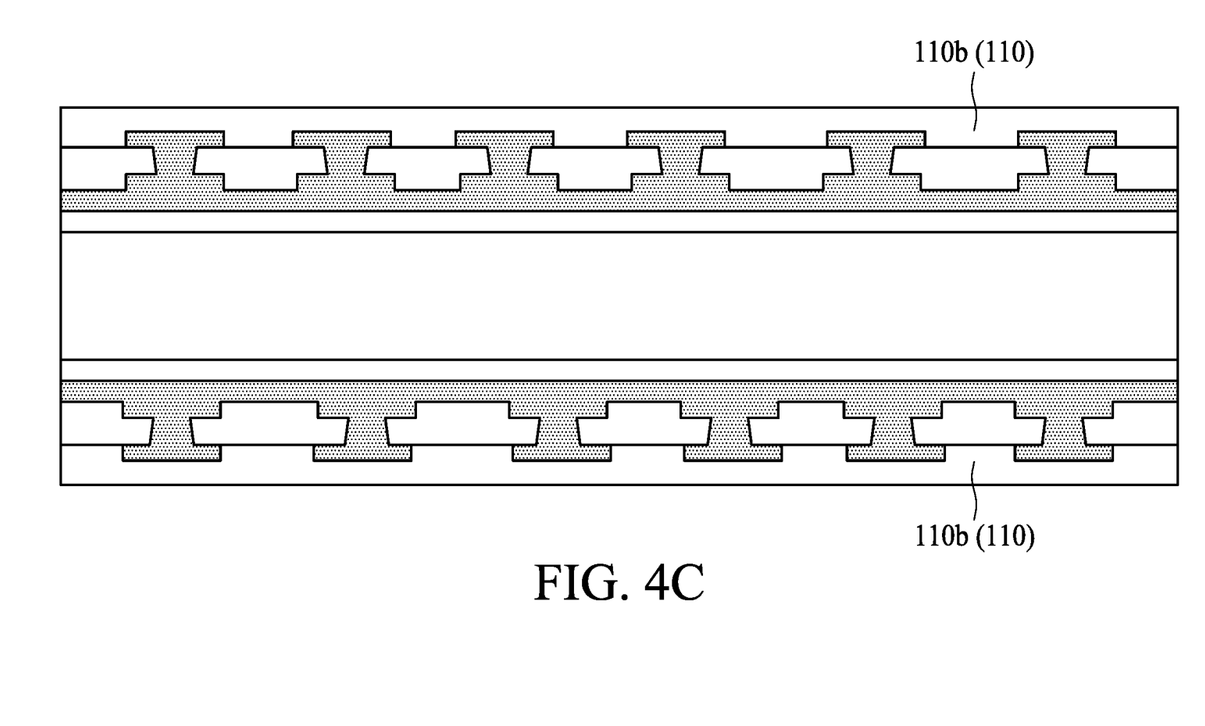

FIG. 4B and FIG. 4C illustrate operation 301. A first insulation 110 including two layers 110a and 110b is formed by processes such as laminating. In some embodiments, operations of forming via holes 720 through the layer 110a and/or the layer 110b, and forming conductors 240 in the via holes 720 or in the layer 110b, are performed. In some embodiments, the first insulation 110 including the layers 110a and 110b has configurations similar to those described above or illustrated in FIG. 1 or FIG. 2.

Figure 4D:
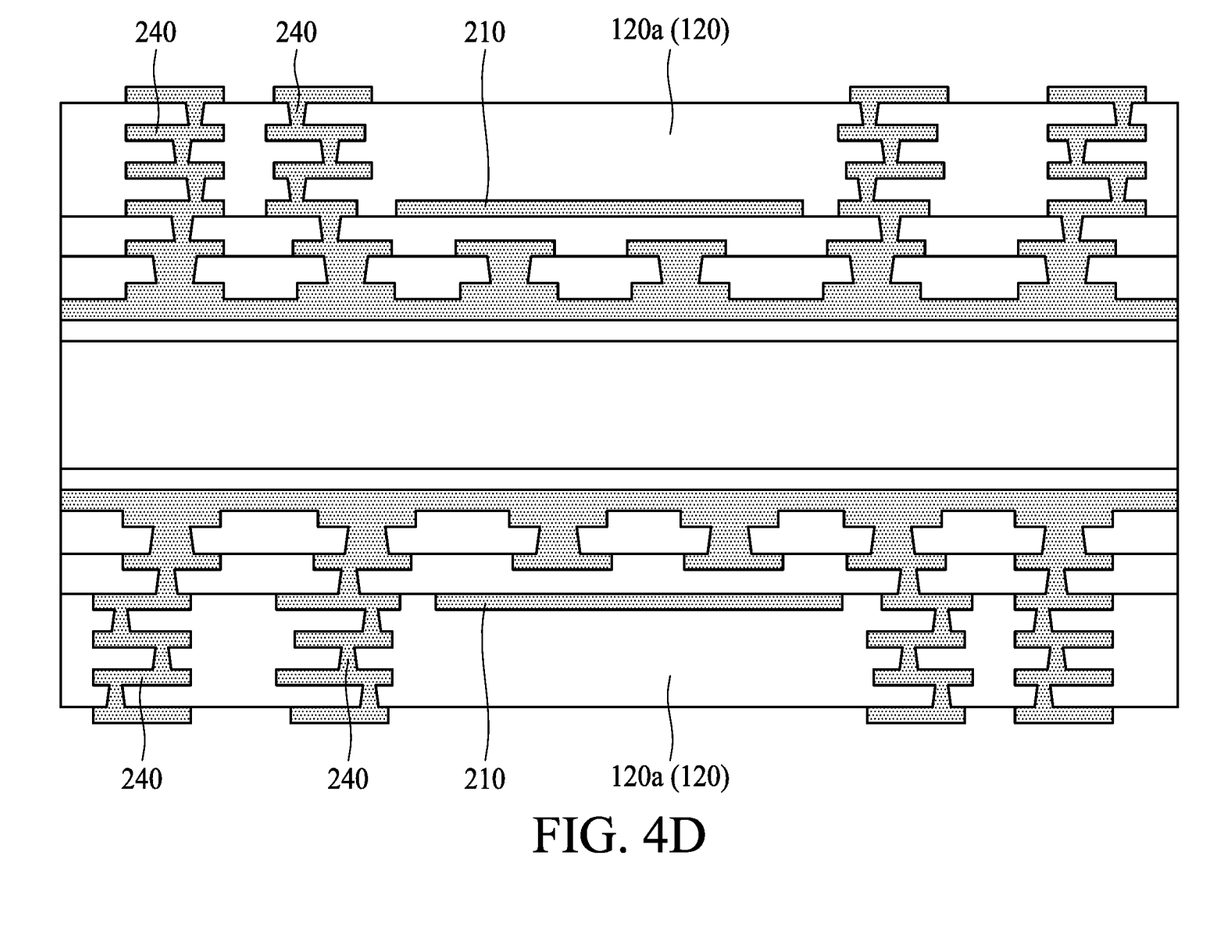

FIG. 4D illustrates operations 302 and 303. In some embodiments, the first conductor 210 is formed on the first insulation 110 by operations such patterning or plating. In some embodiments, a layer 120a of a second insulation 120 is formed on or over the first conductor 210 and the first insulation 110 by processes such as laminating. In some embodiments, operations of forming conductors 240 within or on the layer 120a are performed by processes such as patterning or plating. In some embodiments, the first conductor 210 and the layer 120a of the second insulation 120 have configurations similar to those described above or illustrated in FIG. 1 or FIG. 2.

Figure 4E:
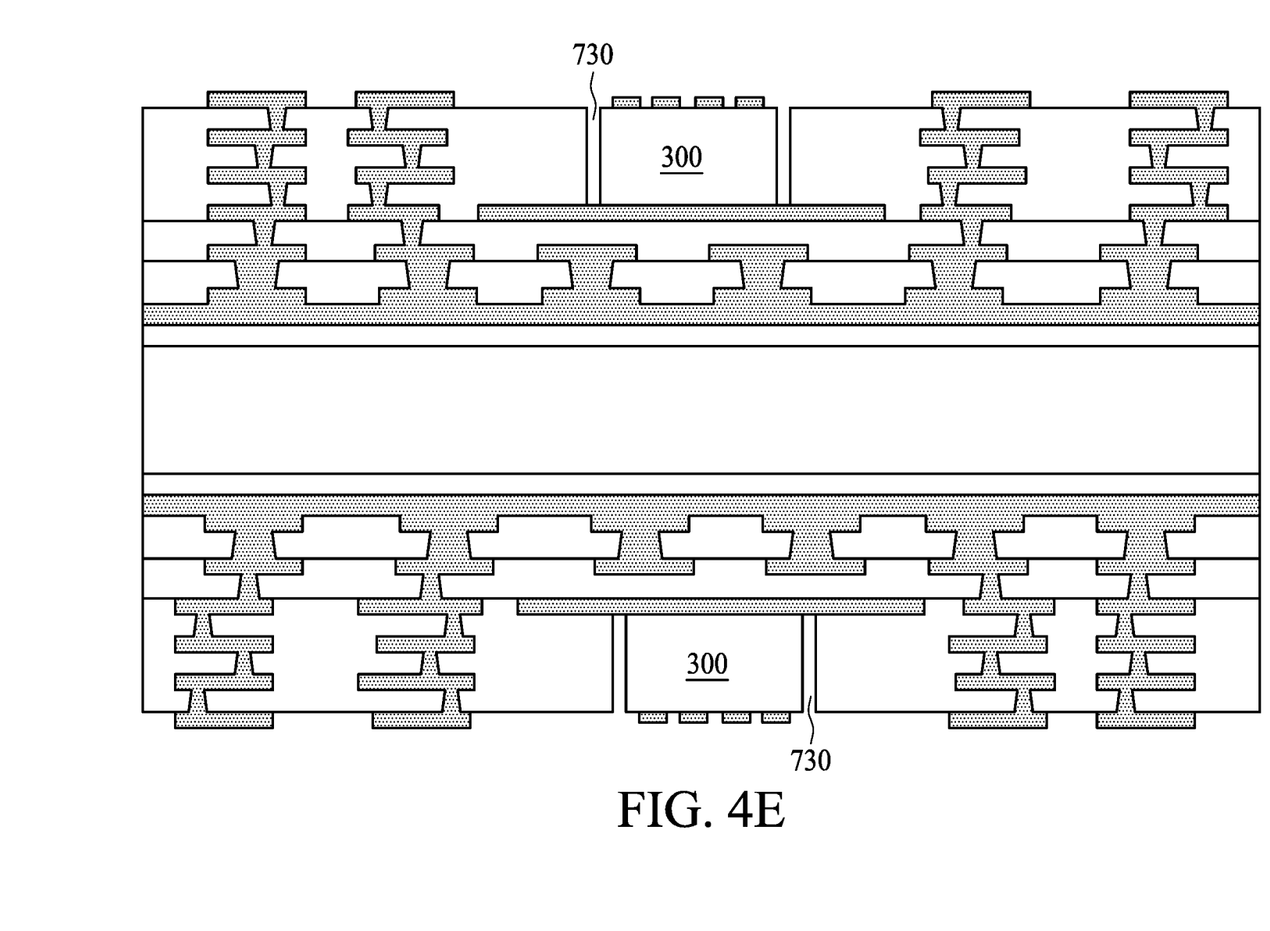
Figure 4F:
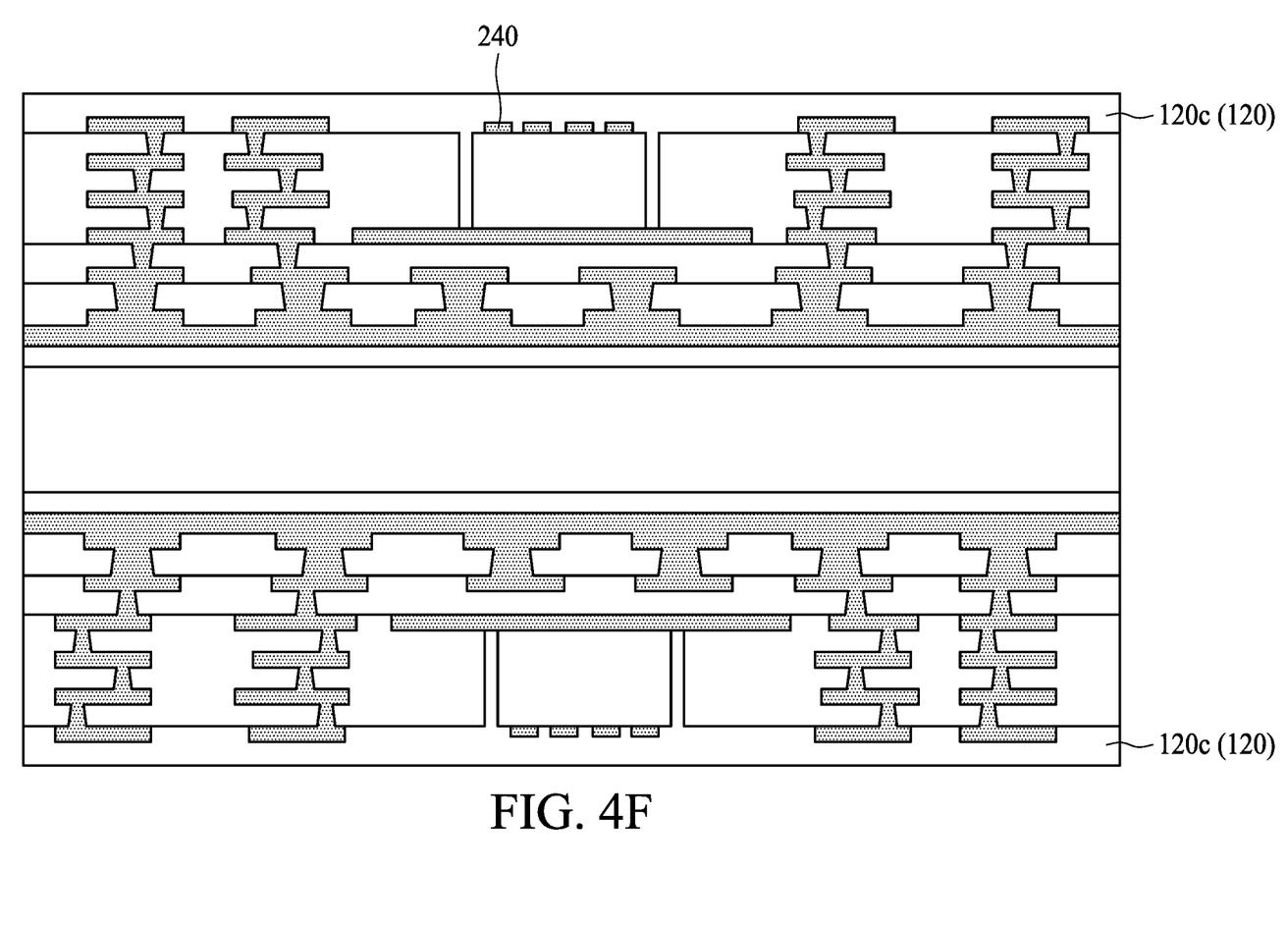

FIG. 4E and FIG. 4F illustrate operations 304 and 305. An electronic device 300 is bonded on the first conductor 210 by processes such as hybrid bonding or fusion bonding or by a die attach film (DAF). In some embodiments, an operation of forming a cavity 730 through the second insulation 120 to expose the first conductor 210 by processes such as laser drilling is performed before bonding the electronic device 300. As shown in FIG. 4F, another layer 120c of the second insulation 120 is formed on the electronic device 300, on the layer 120a and between the electronic device 300 and the layer 120a to fill the cavity 730, such that the electronic device 300 is embedded in the second insulation 120. In some embodiments, several conductors 240 are formed on the electronic device 300. In some embodiments, the electronic device 300 and the layer 120c have configurations similar to those described above or illustrated in FIG. 1 or FIG. 2.

Figure 4G:
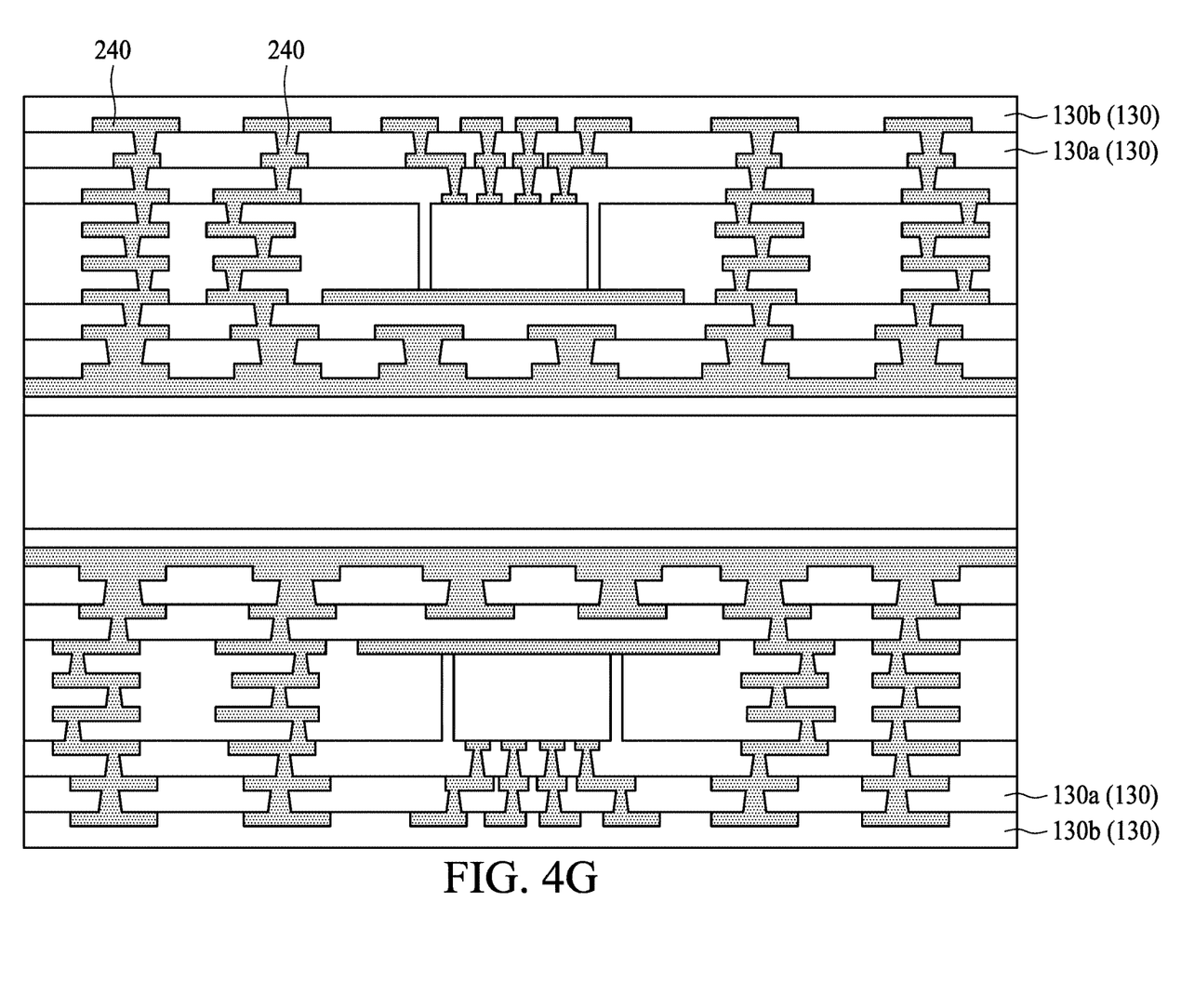

FIG. 4G illustrates operation 306. A third insulation 130 including layers 130a and 130b is formed on the second insulation 120 by processes such as laminating. In some embodiments, operations of forming several conductors 240 in the third insulation 130 are performed. In some embodiments, the third insulation 130 and the conductors 240 have configurations similar to those described above or illustrated in FIG. 1 or FIG. 2.

Some embodiments of the present disclosure provide a semiconductor structure including a first insulation, a second insulation over the first insulation, a third insulation over the second insulation, a first conductor proximal to a boundary between the first insulation and the second insulation, and an electronic device electrically connected to the first conductor and at least partially surrounded by the second insulation. A coefficient of thermal expansion (CTE) of the second insulation is larger than a CTE of the first insulation and larger than a CTE of the third insulation.

Some embodiments of the present disclosure provide a semiconductor structure including a first insulation, a second insulation over the first insulation, a die over the second insulation, a first conductor proximal to a boundary between the first insulation and the second insulation, and an electronic device bonded with the first conductor and at least partially surrounded by the second insulation and electrically connected to the die. A CTE of the second insulation is larger than a CTE of the first insulation and larger than a CTE of the die.

Some embodiments of the present disclosure provide a method for manufacturing a semiconductor structure including forming a first insulation, forming a first conductor on the first insulation, forming a second insulation over the first conductor and the first insulation, bonding an electronic device on the first conductor, embedding the electronic device in the second insulation, and forming a third insulation over the electronic device and the second insulation. A CTE of the second insulation is larger than a CTE of the first insulation and larger than a CTE of the third insulation.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A semiconductor structure, comprising:
   a first insulation;
   a second insulation over the first insulation;
   a third insulation over the second insulation;
   a first conductor proximal to a boundary between the first insulation and the second insulation; and
   an electronic device electrically connected to the first conductor and at least partially surrounded by the second insulation, wherein
   a coefficient of thermal expansion (CTE) of the second insulation is larger than a CTE of the first insulation and larger than a CTE of the third insulation.

2. The semiconductor structure of claim 1, wherein a Young's modulus of the second insulation is lower than a Young's modulus of the first insulation and lower than a Young's modulus of the third insulation.

3. The semiconductor structure of claim 1, wherein the first conductor is at least partially surrounded by the first insulation.

4. The semiconductor structure of claim 1, wherein the electronic device is bonded on the first conductor.

5. The semiconductor structure of claim 1, wherein a surface of the first conductor has an area dented into the first conductor and lower than another area of the surface, the surface facing the third insulation.

6. The semiconductor structure of claim 5, wherein the area of the first conductor has a greater roughness than another area of the first conductor.

7. The semiconductor structure of claim 1, wherein a portion of the second insulation is between the electronic device and the first insulation.

8. The semiconductor structure of claim 1, wherein a portion of the second insulation protrudes into the first insulation.

9. The semiconductor structure of claim 1, wherein a surface of the electronic device is proximal to a boundary between the second insulation and the third insulation, the surface facing away from the first insulation.

10. The semiconductor structure of claim 1, wherein a surface of the electronic device is covered by the second insulation, the surface facing away from the first insulation.

11. The semiconductor structure of claim 1, wherein the first insulation comprises at least one glass-clothed layer.

12. The semiconductor structure of claim 1, wherein the second insulation comprises an ajinomoto build-up film (ABF) material.

13. The semiconductor structure of claim 1, wherein the third insulation comprises at least one glass-clothed layer.

14. The semiconductor structure of claim 1, further comprising:
a second conductor, a portion of the second conductor being electrically connected to the electronic device and surrounded by the second insulation, another portion of the second conductor being surrounded by the third insulation.

15. The semiconductor structure of claim 14, further comprising a die over the third insulation and electrically connected to the second conductor.

16. The semiconductor structure of claim 1, wherein a surface of the first conductor is coplanar with a surface of the first insulation, the surface of the first conductor facing away from the third insulation.

17. A semiconductor structure, comprising:
a first insulation;
a second insulation over the first insulation, the second insulation being in contact with the first insulation;
a die over the second insulation;
a first conductor proximal to a boundary between the first insulation and the second insulation; and
an electronic device bonded with the first conductor and at least partially surrounded by the second insulation and electrically connected to the die, wherein
a coefficient of thermal expansion (CTE) of the second insulation in contact with the first insulation is larger than a CTE of the first insulation and larger than a CTE of the die.

18. The semiconductor structure of claim 17, wherein the die is bonded with a surface of the electronic device, the surface facing away from the first insulation.

19. The semiconductor structure of claim 17, wherein a Young's modulus of the second insulation is lower than a Young's modulus of the first insulation and lower than a Young's modulus of the die.

20. A method of manufacturing a semiconductor structure, comprising:
forming a first insulation;
forming a first conductor on the first insulation;
forming a second insulation over the first conductor and the first insulation, the second insulation being in contact with the first insulation;
bonding an electronic device on the first conductor;
embedding the electronic device in the second insulation; and
forming a third insulation over the electronic device and the second insulation; wherein
a coefficient of thermal expansion (CTE) of the second insulation in contact with the first insulation is larger than a CTE of the first insulation and larger than a CTE of the third insulation.

* * * * *